United States Patent [19]

Miller

[11] Patent Number: 5,185,690
[45] Date of Patent: Feb. 9, 1993

[54] HIGH DIELECTRIC CONSTANT SHEET MATERIAL

[76] Inventor: Mark L. Miller, 2900 W. Highland St., Apt. 266, Chandler, Ariz. 85224

[21] Appl. No.: 778,683

[22] Filed: Oct. 16, 1991

[51] Int. Cl.⁵ .............. H01G 4/10; H05K 1/18; H01B 7/00
[52] U.S. Cl. .................... 361/321; 361/397; 174/72 B
[58] Field of Search ............. 361/320, 321, 328, 329, 361/330, 306, 397, 401, 407, 412, 414; 174/72 B

[56] References Cited

U.S. PATENT DOCUMENTS

| | | | |
|---|---|---|---|
| 4,236,038 | 11/1980 | Taylor | 174/72 B |
| 4,236,046 | 11/1980 | De Vries | 174/72 B |
| 4,399,321 | 8/1983 | Gottlieb | 174/72 B |
| 4,853,827 | 8/1989 | Hernandez | 361/321 |
| 5,099,395 | 3/1992 | Sagisaka et al. | 361/414 |

Primary Examiner—Donald A. Griffin
Attorney, Agent, or Firm—Fishman, Dionne & Cantor

[57] ABSTRACT

A high dielectric sheet material comprises a monolayer of spaced high dielectric chips (e.g., ceramic single layer capacitor or SLC chips) which have been located or placed within spaced openings or windows formed in a dielectric spacer sheet. Top and bottom conductive sheets, preferably metallic foil sheets, are adhesively placed in intimate mechanical and electrical contact with the respective top and bottom external surfaces of the chips and dielectric spacer sheet. An adhesive is interposed between the metallic foil sheets and the dielectric spacer sheet (filled with high dielectric chips) such that the adhesive material holds the substrate together without interfering with electrical contact between the high dielectric chips and top and bottom foil sheets. This is preferably accomplished through the use of roughened surfaces formed on both the foil sheets and external high dielectric chips. The resultant high dielectric sheet material of this invention is drillable, platable, printable, etchable, laminable and highly reliable. In addition, this high dielectric sheet material may be used in a variety of electronic applications including as a component in the manufacture of multilayer circuit boards, capacitive elements and bus bars.

47 Claims, 9 Drawing Sheets

HIGH DIELECTRIC CONSTANT SHEET MATERIAL

BACKGROUND OF THE INVENTION

This invention relates generally to an improved high dielectric constant sheet material for use in electronic circuitry and electronic components. More particularly, this invention relates to a high dielectric constant sheet material which is drillable, platable and is well suited for a variety of uses including high current laminated bus bars, multilayer printed circuit boards, flexible circuits and decoupling capacitors.

It will be appreciated that there is an ever increasing need for a reliable, high dielectric material which may be used for a variety of applications in electronic circuitry design and manufacture. Presently, flexible high dielectric materials of this type are manufactured by mixing small particles (for example 1-3 microns) of a high dielectric constant material into a flexible polymeric matrix. Surprisingly, the resultant effective dielectric constant of the dielectric impregnated polymer is relatively low. For example, the dielectric constant of a Z5U BaTiO$_3$ is in the range of 10,000 to 12,000. However, when such Barium Titanate is mixed with a flexible polymer such as polyimide, polyester, polyetherimide and like materials, the effective dielectric constant realizable is only on the order of 20 to 40 (depending on the loading ratio of the dielectric in the polymer).

An improved high dielectric sheet material is described in U.S. Pat. No. 4,908,258, which is assigned to the assignee hereof and incorporated herein by reference. The high dielectric sheet material of U.S. Pat. No. 4,908,258 comprises a monolayer of multilayer or single layer high dielectric (for example ceramic) chips or pellets of relatively small area and thickness which are arranged in a planar array. These high dielectric constant chips are spaced apart by a small distance. The spaces between the chips are then filled with a flexible polymer/adhesive to define a cohesive sheet with the polymer binding the array of high dielectric (for example ceramic) chips together. Next, the opposite planar surfaces of the array (including the polymer) are metallized (for example, electroless plated or metallized by vacuum deposition, sputtering, etc.) to define opposed metallized surfaces. The end result is a relatively flexible high capacitance dielectric film or sheet material which is drillable, platable, printable, etchable, laminable and reliable.

The high dielectric sheet material of U.S. Pat. No. 4,908,258 is suitable for many applications. For example, U.S. Pat. No. 4,853,827 (assigned to the assignee hereof and incorporated herein by reference) relates to a multilayer capacitor whose construction is based on the material of U.S. Pat. No. 4,908,258. Similarly, U.S. Pat. No. 5,051,542 (assigned to the assignee hereof and incorporated herein by reference) relates to a bus bar whose construction incorporates the material of U.S. Pat. No. 4,908,258. Finally, U.S. application Ser. No. 291,531 filed Dec. 29, 1988, now U.S. Pat. No. 5,065,285 issued Nov. 12, 1991 (assigned to the assignee hereof and incorporated herein by reference) also utilizes the sheet material of U.S. Pat. No. 4,908,258 in the construction of a multilayer printed wiring board.

While well suited for their intended purposes, the materials and devices of U.S. Pat. Nos. 4,908,258, 4,853,827, 5,051,542 and USSN 291,531 do suffer from certain drawbacks and deficiencies in terms of the relatively complicated and error prone process required during manufacturing. These prior art high dielectric sheet materials (and devices constructed which incorporates these materials) utilize complicated fixturing and polymer resin mold/casting tools to create a polymer matrix with exposed high dielectric chip surfaces. It will be appreciated that it is extremely difficult to make fixturing and polymer resin mold/casting tools to hold and orient very thin, fragile ceramic chips and thereafter fill the space between the chips without polymer resin flashing onto the external surfaces of the chips. Moreover, the relatively expensive and complicated tooling required to manufacture the prior art high dielectric sheet material significantly limit the maximum area of the sheet (e.g., 9 inch by 9 inch maximum).

SUMMARY OF THE INVENTION

The above-discussed drawbacks and deficiencies of the prior art are overcome or alleviated by the improved high dielectric sheet material of the present invention. In accordance with the present invention, a high dielectric sheet material comprises a monolayer of spaced high dielectric chips (e.g., ceramic single layer capacitor or SLC chips) which have been located or placed within spaced openings or windows formed in a dielectric spacer sheet. Top and bottom conductive sheets, preferably metallic foil sheets, are adhesively placed in intimate mechanical and electrical contact with the respective top and bottom external surfaces of the chips and dielectric spacer sheet.

An adhesive is interposed between the metallic foil sheets and the dielectric spacer sheet (filled with high dielectric chips) such that the adhesive material holds the substrate together without interfering with electrical contact between the high dielectric chips and top and bottom foil sheets. This is preferably accomplished through the use of roughened surfaces formed on both the foil sheets and external high dielectric chips.

The resultant high dielectric sheet material of this invention is drillable, platable, printable, etchable, laminable and highly reliable. In addition, this high dielectric sheet material may be used in a variety of electronic applications including as a component in the manufacture of multilayer circuit boards, capacitive elements and bus bars.

An important feature of this invention which leads to a significant improvement relative to the prior art of, for example, U.S. Pat. No. 4,908,258, is the relative ease and low cost of manufacturing. As a result of the dielectric spacer sheet used in the present invention, simple manual or semi-automatic processing steps may be utilized in the reliable manufacture of the high dielectric sheet material. In contrast to the prior art manufacturing process, in accordance with the present invention, placement and location of the high dielectric chips are easily controlled by dielectric "window" spacing. These windows can readily accommodate dielectric chip thickness variations as well as a wide range of chip sizes. The windows may be easily formed in the dielectric sheet by punching or like methods using low cost tools. Moreover, the arrangement of these windows may be easily modified using such tooling. This low cost and less complicated manufacturing process permits very large, continuous sheets of high dielectric material to be constructed.

The above-discussed and other features and advantages of the present invention will be appreciated and understood by those of ordinary skill in the art from the following detailed description and drawings.

BRIEF DESCRIPTION OF THE DRAWINGS

Referring now to the drawings, wherein like elements are numbered alike in the several FIG..

DESCRIPTION OF THE PREFERRED EMBODIMENT

Figure 1:
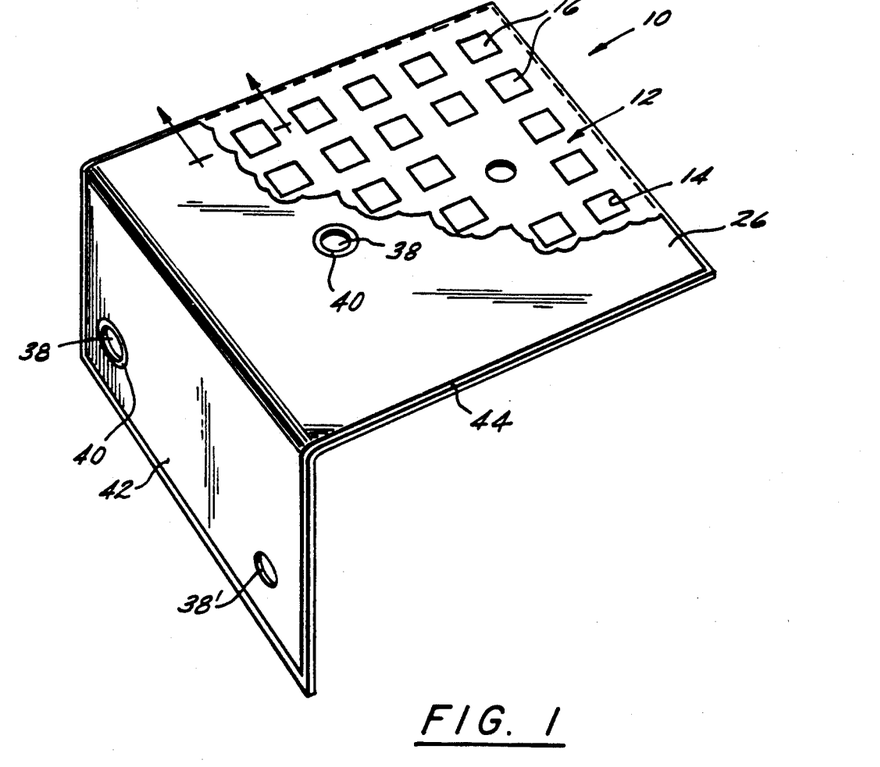
FIG. 1 is a perspective view of a high dielectric constant flexible sheet formed in a multiplanar shape in accordance with the present invention.
Figure 2:
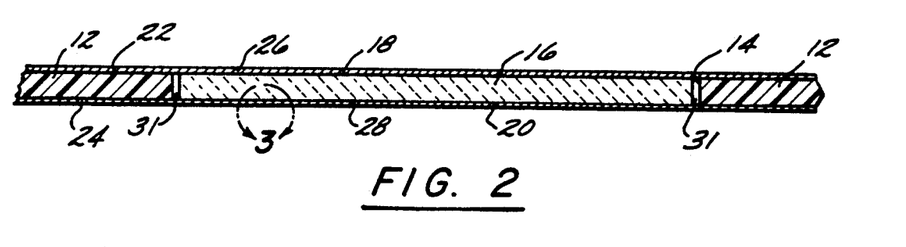
FIG. 2 is a cross-sectional elevation view along the lines 2—2 of FIG. 1.
Figure 3:
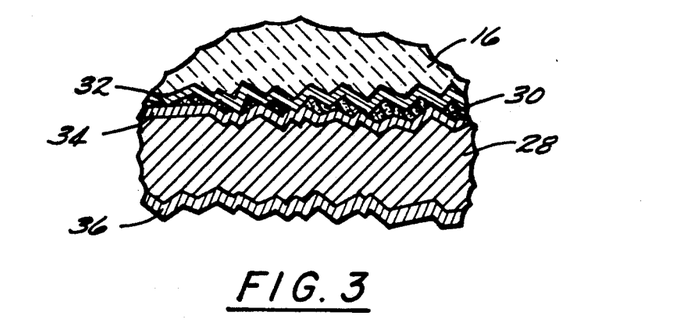
FIG. 3 is an enlarged side elevation view of a portion of FIG. 2.

Referring first to FIGS. 1-3, the high dielectric constant flexible sheet material of the present invention is generally identified at 10 and comprises a central dielectric spacer sheet 12 having an array of openings or windows 14 formed (e.g. punched) therethrough. Dielectric spacer sheet 12 comprises a suitable polymeric material including, but not limited to a plastic film such as polyester, polyimide or any other suitable heat resistant plastic film. Preferably, dielectric spacer is comprised of a flexible sheet of polyester film. Spacer sheet 12 may also be reinforced with a suitable fiber or other filler material such as glass fiber, mineral filler or the like.

In each of these windows is placed a high dielectric constant chip 16 which preferably comprises a ceramic single layer capacitor (SLC) chip. Chips 16 may be arranged in any desired pattern or array, either having an ordered spacing or a random spacing. Preferably, the upper and lower surfaces 18, 20 of each chip 16 coterminate with the upper and lower surfaces 22, 24 of dielectric sheet 12.

The upper planar surface defined by upper surfaces 18 of chips 16 and upper surface 22 of dielectric sheet 12 is provided with an outer upper conductive sheet 26, preferably comprised of a metallic foil. Similarly, the lower planar surface defined by lower chip surfaces 20 and lower dielectric sheet surface 24 is provided with an outer lower conductive sheet 28, preferably comprised of metal foil. Metal foils 26 and 28 (e.g., aluminum, copper, nickel or tin) are preferably adhesively bonded to both dielectric sheet 12 and high dielectric chips 16 using a suitable adhesive 30 wherein electrical contact will be maintained between the metal foils 26, 28 and the plurality of high dielectric chips 16. Preferably, this mechanical and electrical attachment is accomplished by providing a roughened outer surface to both surfaces 18 and 20 of dielectric chips 16 and the metal foils 26 and 28 as best shown in FIG. 3. Thus, as clearly seen in FIG. 3, adhesive layer 30 will provide mechanical attachment between lower metal foil 28 and dielectric chips 16 while permitting electrical contact between chips 16 and foil 28. The use of such roughened surfaces in combination with a suitable adhesive to provide both mechanical attachment as well as electrical contact is known and described, for example, in U.S. Pat. No. 4,236,038, which is assigned to the assignee hereof and incorporated herein by reference. Any suitable adhesive may be used such as polyester or epoxy.

Depending upon the specific dimensions of the windows 14 and chips 16, a small gap 31 (e.g., 0.003 inch) may be formed by the allowed tolerances. If such a small gap 31 is present (see FIG. 2), the nonconductive adhesive 31 will fill in the gap and provide electrical insulation.

Alternatively, rather than roughened edges, a suitable electrically conductive adhesive may be used to interconnect chips 16, spacer 12 and metal layers 26, 28. However, a non-conductive adhesive as described above is preferred to prevent shorting in the cases where tolerance gaps are formed. Still another alternative is to use a metallization technique so as to define a thin (e.g., about 10-50 micro inches) metallized layer 26 and 28. These thin metallized layers may then be plated up to higher thicknesses (e.g., about 1-2 mils) by well known electroplating techniques to define layers 26 and 28. The thin metallized layers may be produced using any known method including by electroless plating or by vapor deposition techniques including vacuum depositions, sputtering, etc.

In a preferred embodiment, outer surfaces 18 and 20 of dielectric chips 16, as well as the outer surfaces of each of the metal foils 26 and 28, are provided with coatings (identified at 32, 34 and 36 in FIG. 3) of a suitable conductive material such as tin or nickel. Such coatings (which may be applied by any known process such as vapor deposition, plating or flash coating) are preferred to insure appropriate electrical contact between the metal foils 26, 28 and chips 16.

Figure 6:
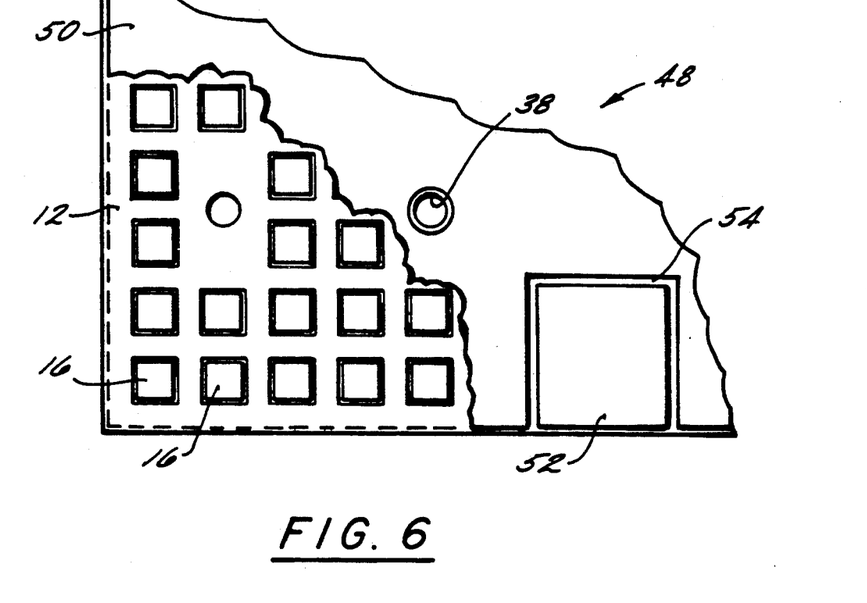
FIG. 6 is a top plan view with a portion partially broken away showing an alternative embodiment of the high dielectric constant sheet material of FIG. 1.
Figure 7:
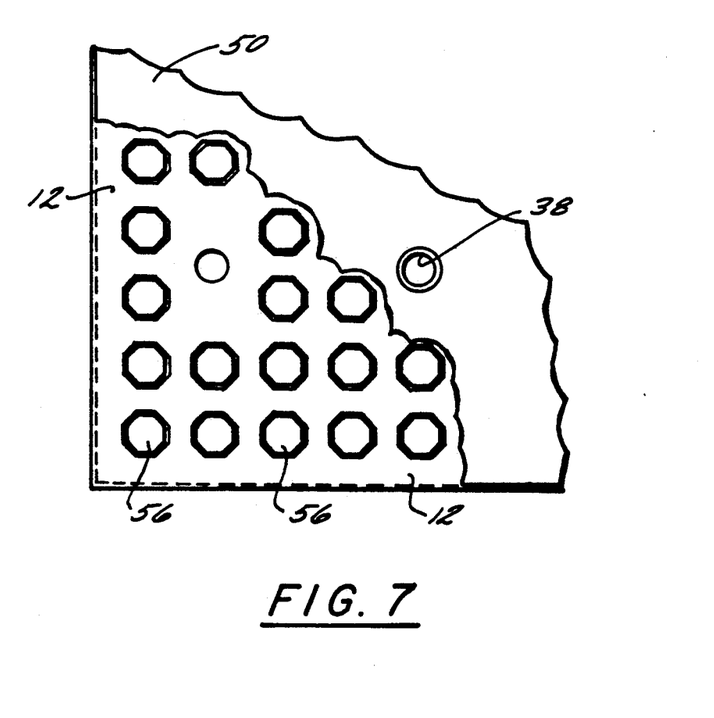
FIG. 7 is a top plan view with a portion partially broken away depicting still another embodiment of the high dielectric constant sheet material of FIG. 1.

The flexible high dielectric sheet material 10 of the present invention is drillable, platable, printable, etchable, laminable and highly reliable. For example, the flexible sheet 10 of FIG. 1 has provided therethrough a plurality of through-holes 38. The through-holes 38 shown in FIG. 1 are electrically isolated through sheet 10 and positioned so as not to interfere with any of the dielectric chips 16 (which are normally quite brittle in nature). Thus, a small gap 40 is provided between the outer conductive foils 26, 28 and each through hole 38. Alternatively, the holes may be formed as conductive vias (with no electrical isolation) as in via 38'. The dielectric sheet 10 of FIG. 1 will be flexible or at least semi rigid. As a result, the sheet may be formed into a three dimensional or multiplanar configuration as shown by the bent portion 42 in FIG. 1. Of course, the sheet 10 may also be maintained in a strictly planar configuration as in the embodiments of FIGS. 6–8.

Preferably, the periphery of dielectric spacer sheet 12 extends beyond the edges of top and bottom metal foil 26 and 28 as shown by the extension 44 in FIG. 1. It will be appreciated that extension 44 eliminates possible shorting between opposed foil layers 26 and 28 which can occur due to cutting burrs at the substrate edge or opposed foil edges rolling-over during lamination. Thus, the metal foil layers 26, 28 will connect all ceramic chips 16 in parallel without the risk of edge shorting.

Turning now to FIGS. 4A–D and 5A–D, a preferred method of constructing the present invention will now be described. In a first construction step set forth in FIGS. 4A, 4B and 5A,5B, a sheet of foil (bottom sheet 28) is obtained. Next, a layer of adhesive 30 is coated onto foil 28. Preferably, adhesive 30 comprises a B-staged adhesive material such as epoxy or polyester. Such B-staged adhesives will not squeeze out and any associated solvent cleaning (required when using solvent based adhesives) is eliminated using the B-staged adhesive materials. Solvent cleaning is not preferred as it requires use of expensive environmentally hazardous materials. Moreover, the cost for solvent cleaning facilities, operators and the like yield loss due to solvent cleaning damage and hazardous waste disposal.

Figure 4A:
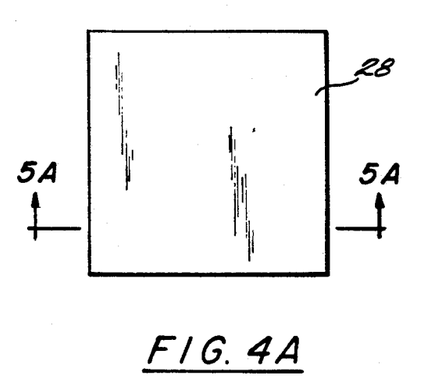
FIGS. 4A-4D are top plan views showing sequential steps in manufacturing the high dielectric constant sheet material of the present invention.
Figure 4B:
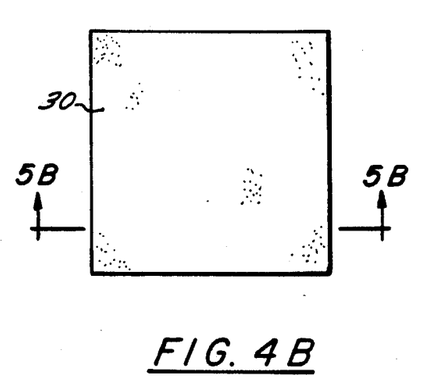
Figure 4C:
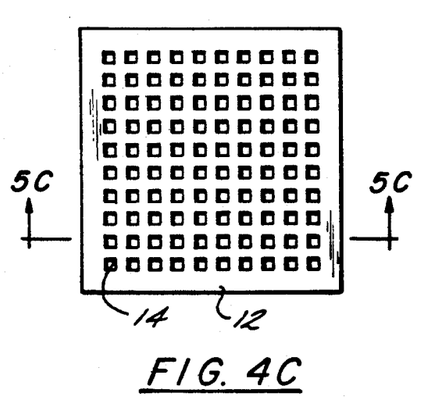
Figure 4D:
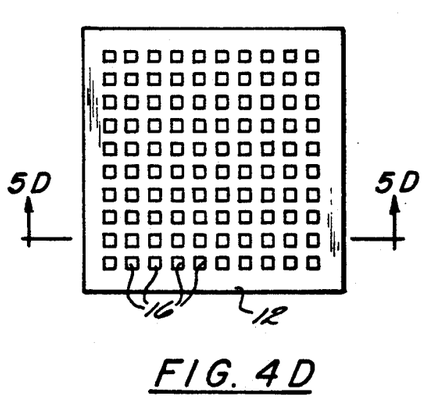
Figure 5A:
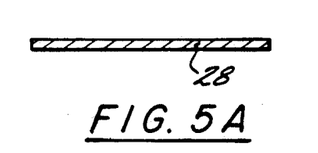
FIGS. 5A-5D are cross-sectional elevation views respectively along the lines indicated in FIGS. 4A-4D.
Figure 5B:
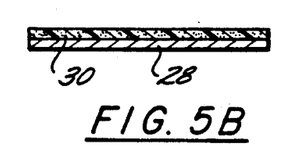
Figure 5C:
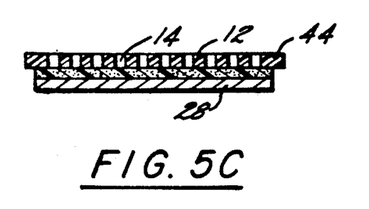
Figure 5D:
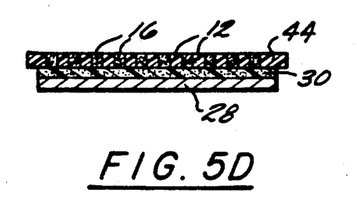

Referring now to FIGS. 4C and 5C, the dielectric spacer sheet 12 is then placed onto adhesively coated foil 28. Spacer sheet 12 has been previously punched with a suitable array of openings or windows 14. Next, as shown in FIGS. 4D and 5D, high dielectric constant chips 16 are placed within the windows 14 of dielectric spacer sheet 12. Thereafter, top foil 26, having been precoated with an appropriate B-staged adhesive 29, is heat tacked over the assembly of FIGS. 4D and 5D. Thereafter, the entire assembly is laminated under heat and pressure to provide the final high dielectric constant flexible sheet material 10.

It will be appreciated that the high dielectric sheet material of the present invention has a construction which leads to tremendous flexibility and design choice in its final configuration. For example, referring to FIG. 6, a high dielectric sheet material in accordance with the present invention is shown generally at 48 and includes an upper foil layer composed of two localized regions of different potentials including a first region 50 and a second smaller region 52. It will be appreciated that a gap 54 is provided between the foils to provide the required electrical isolation. The isolated electrical regions may be manufactured in a variety of known methods such as by laying up separate electrode regions, masking separate metal plating regions, masking separate metal vapor deposition regions or etching continuous electrodes so as to create the two different potential regions. Of course, any number of isolated potential regions may be made on either the upper, lower or both surfaces of dielectric sheet 48.

Still another variation of the present invention may be made in the selection of the shape and configuration of dielectric chip 16. For example, in FIG. 7, an octagonally shaped dielectric chip 56 is used in a dielectric sheet material 58. Of course, any other shaped dielectric chip may be used in the present invention including the cylindrical and alternative shapes shown in FIGS. 5A–C of U.S. Pat. No. 4,908,258. It will be appreciated that certain polygonal shapes such as the octagonal chips 56 of FIG. 7 may be preferred over the rectangular or square shaped chips 16 of FIG. 1 as the octagonal chips eliminate the fragile corners associated with square shaped chips (which are the most susceptible to fracture or breakage).

Figure 8:
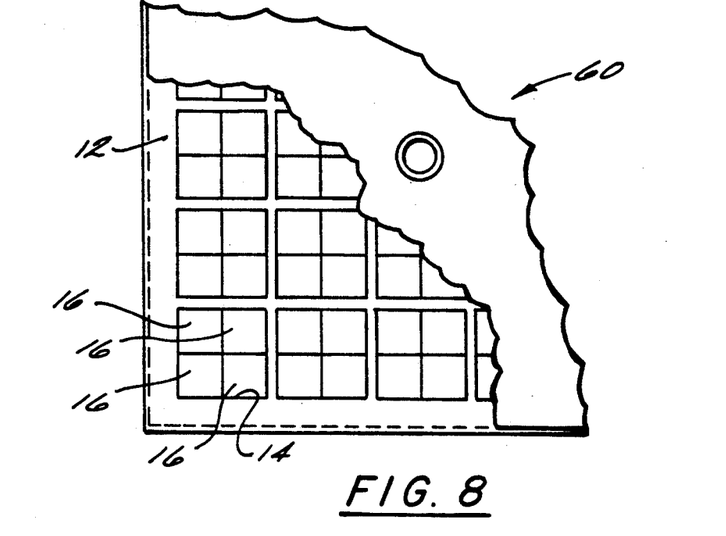
FIG. 8 is a top plan view with a portion partially broken away showing still another embodiment of the high dielectric constant sheet material of FIG. 1.

Referring to FIG. 8, still another embodiment of a high dielectric constant flexible sheet material in accordance with the present invention is shown generally at 60. Sheet 60 of FIG. 8 has been provided with relatively larger windows 14 formed through spacer sheet 12 so as to permit groups of dielectric chips 16 to be placed in a single window. Such groupings of dielectric chips 16 lead to higher dielectric capacitance values per a given area of the high dielectric sheet material. It will be appreciated that any number of chips and groupings thereof may be utilized in accordance with the present invention.

Figure 9:
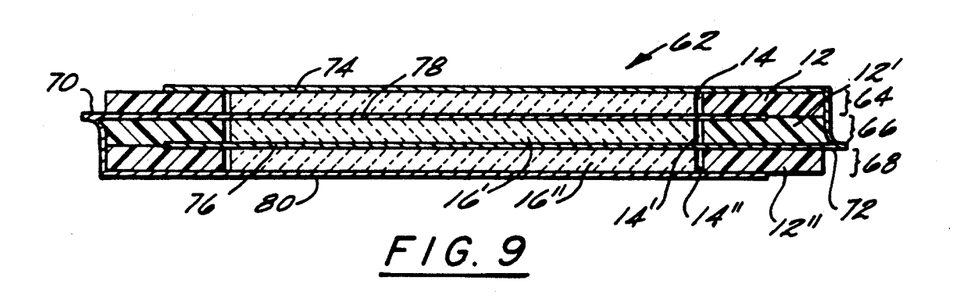
FIG. 9 is a cross-sectional elevation view of the high dielectric constant sheet material of the present invention constructed in a multilayer construction.

Referring now to FIG. 9, a multiple layer embodiment of the high dielectric constant flexible sheet material of the present invention is shown generally at 62. The multiple layer component 62 comprises three layers 64, 66, and 68 of the high dielectric flexible sheet material of FIG. 1. Layer 64 is is comprised of a spacer sheet 12 having windows 14 formed therein for receiving high dielectric chips 16. Similarly, layer 66 includes spacer sheet 12'; windows 14' and chips 16' while layer 68 includes spacer sheet 12", windows 14" and chips 16". Component 62 is configured as a multilayer capacitor with alternating conductive surfaces being electrically interconnected and terminating at tabs 70 and 72. Thus, conductive layers 74 and 76 are interconnected as are conductive layers 78 and 80.

Referring now to FIGS. 10–13, a high capacitance multilayer printed circuit board in accordance with the present invention is shown generally at 90. Circuit board 90 comprises a pair of exterior electrically insulative layers 92 and 94 which sandwich therebetween a high dielectric flexible layer 96 of the type described in detail with regard to FIGS. 1–8. Each insulative sheet 92 and 94 include circuit patterns 98 and 100 respectively thereon. As described in detail above, flexible dielectric sheet 96 comprises a planar layer of spaced ceramic chips 102 positioned in a dielectric spacer sheet of polymeric material 104. High dielectric chips 102 and spacer sheet 104 include a planar upper foil 106 and lower foil 108. Foil layers 106 and 108 will act as the voltage and ground planes for the multilayer circuit board 90. Thus, high dielectric flexible layer 96 will function as a decoupling capacitor when a circuit component is electrically attached to board 90. This important feature of the present invention eliminates the need for discrete decoupling capacitor elements and frees valuable board space on the surface of board 90. Insulative layers 92 and 94 may comprise any suitable insulative material including well known circuit board materials FR-4, G-10, G-11 and the like.

Figure 10:
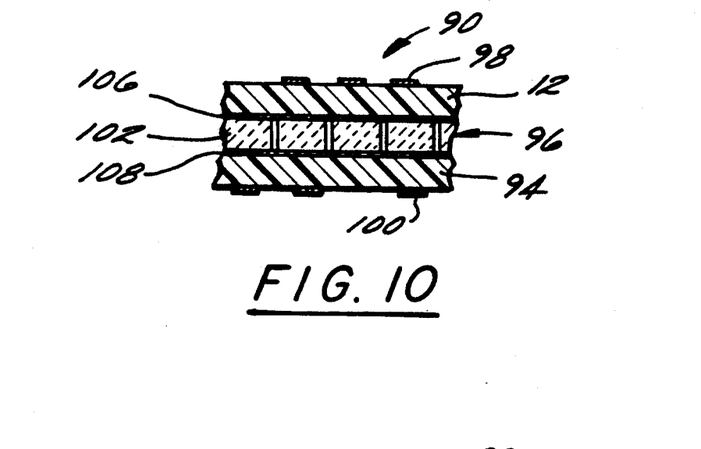
FIG. 10 is a cross-sectional elevation view of a multilayer circuit in accordance with the present invention.
Figure 11:
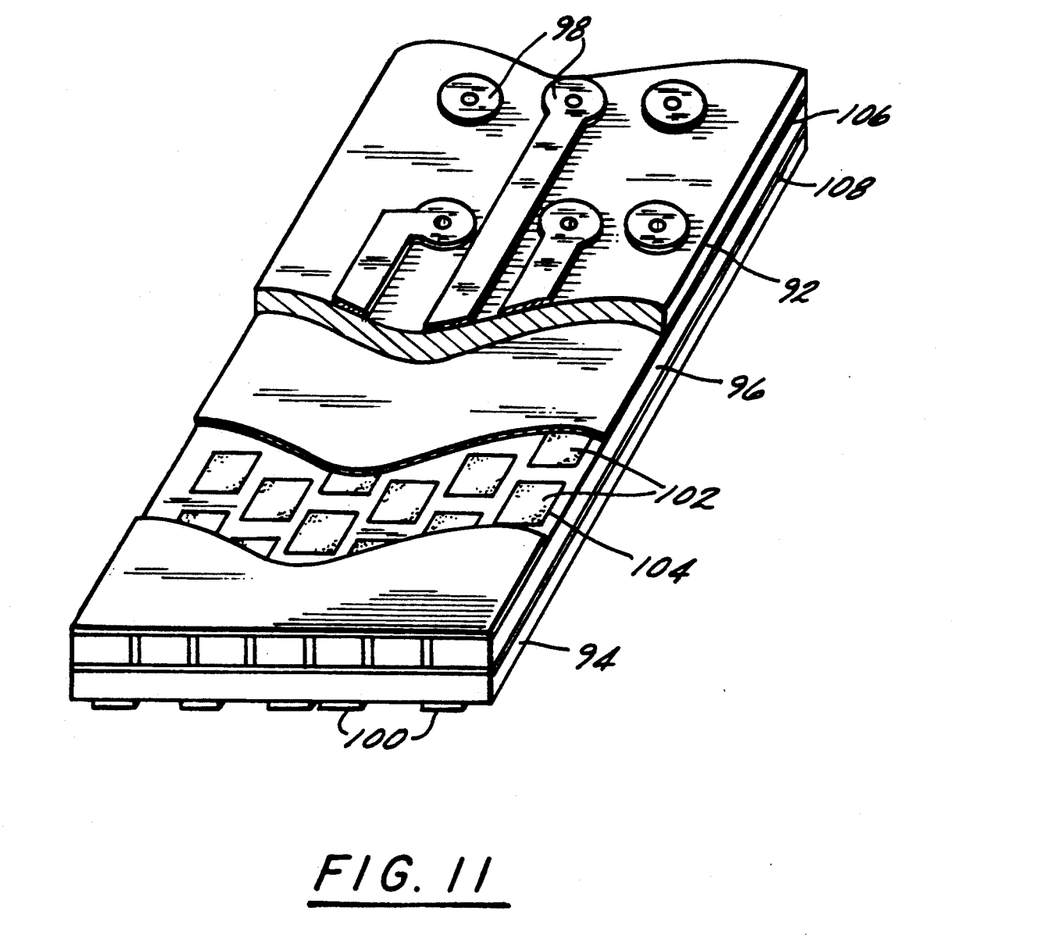
FIG. 11 is a perspective view of the multilayer circuit of FIG. 10.
Figure 12:
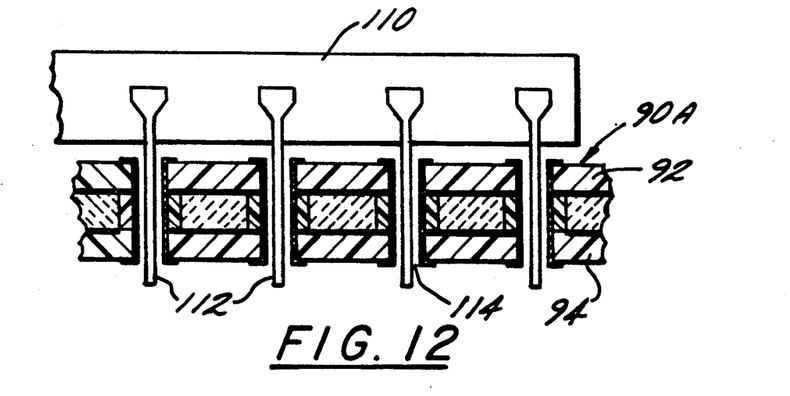
FIG. 12 is a cross-sectional elevation view depicting the multilayer circuit of FIG. 10 having an electronic component mounted in through holes provided therein.

High dielectric flexible sheet 96 may be altered to fine tune Physical parameters on board 90 for particular uses. Also, multiple layers of sheet may be used to provide many voltage planes and interconnections. The thickness of layers 96 may be altered to vary the capacitance of board 90. Because of the design of flexible sheet 96, the capacitance per unit area of the dielectric layer may be varied to a predetermined level. The thickness of electrodes 106 and 108 may also be varied to change the current carrying capacity of the voltage planes and the ground planes. The temperature stability of sheet 96 may also be adjusted.

In addition to simultaneously providing both power distribution and decoupling, and eliminating the need for discrete decoupling capacitors, the multilayer circuit board of the present invention provides many other advantages. Board 90 eliminates the need for expensive pick and place machinery for decoupling capacitors. It also eliminates solder quality problems inherent with decoupling capacitors. Moreover, flexible high dielectric sheet 96 makes multilayer board 90 more dense, more reliable, less costly to assemble, and also improves heat dissipation by virtue of ceramic elements 102 in the flexible dielectric layers.

The multilayer circuit board incorporating the flexible high dielectric constant sheet in accordance with the present invention may be used with either through hole technology or in surface mount applications. For example, in FIG. 12, a dual-in-line integrated circuit package 110 includes a plurality of leads 112 which are mounted in plated through holes 114 in multilayer circuit board 90A. Circuit board 90A is substantially similar to circuit board 90 of FIGS. 10 and 11 with the exception that plated through holes 114 are provided to interconnect circuit patterns 98 and 100 on the two outer surfaces of the board.

Figure 13:
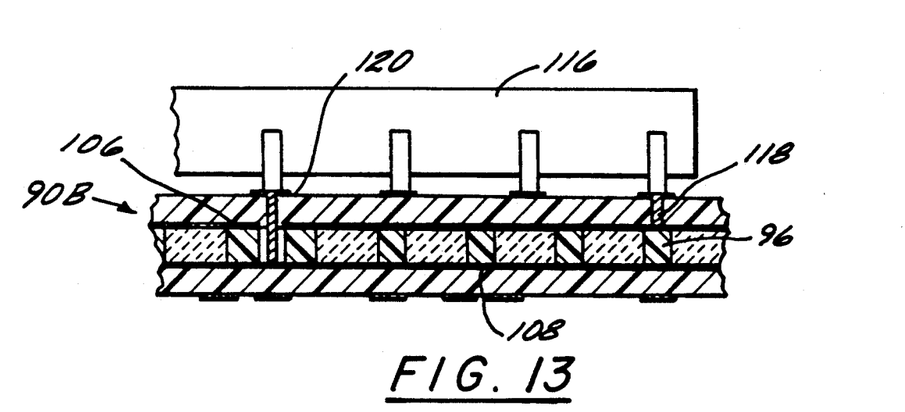
FIG. 13 is a cross-sectional elevation view similar to FIG. 12, but depicting a surface mountable electronic component thereon.

In FIG. 13, a surface mount integrated circuit package 116 is shown on a multilayer circuit board 90B wherein vias 118 and 120 have been provided to interconnect with the flexible dielectric sheet 96 within circuit board 90B. Note that a hole 122 has been drilled through flexible sheet 96 to permit attachment between the lower electrode 108 and via 120.

Figure 14:
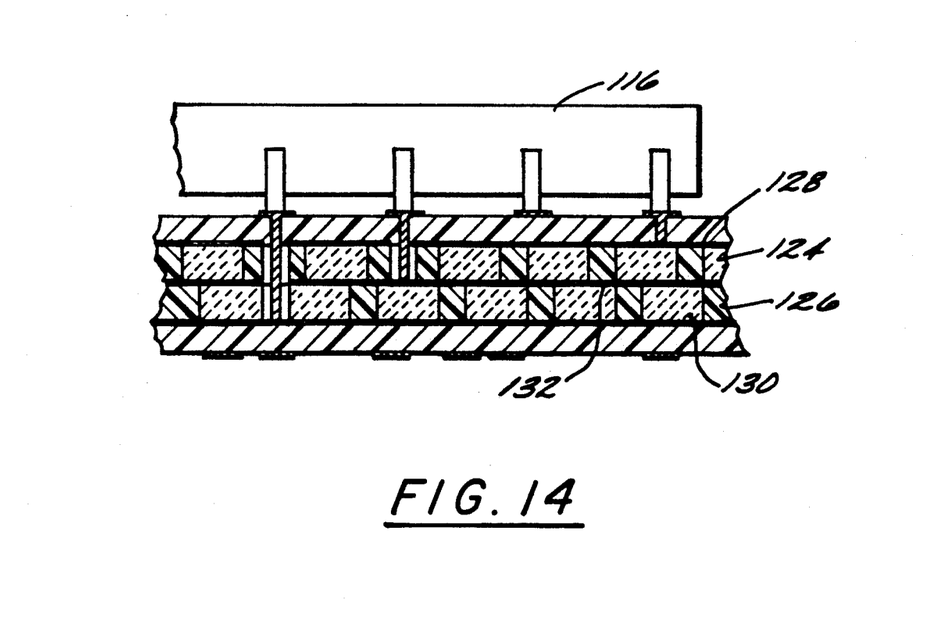
FIG. 14 is a cross-sectional elevation view similar to FIG. 13 but depicting an alternative embodiment thereof.

Turning now to FIG. 14, as mentioned with regard to FIG. 9, a plurality of flexible dielectric sheets 96 may be used in the multilayer circuit board of the present invention. Thus, in FIG. 14, a pair of flexible dielectric sheets 124 and 126 are mounted adjacent one another to provide a pair of outer voltage planes 128 and 130 and an inner ground plane 132. As in the embodiment of FIG. 13, holes are drilled in the flexible high dielectric sheets to provide attachment with the several voltage planes 128, 130 and ground plane 132. Of course, any number of flexible dielectric sheets may be stacked up within the circuit board so as to obtain relatively high preselected capacitance values.

Figure 15:
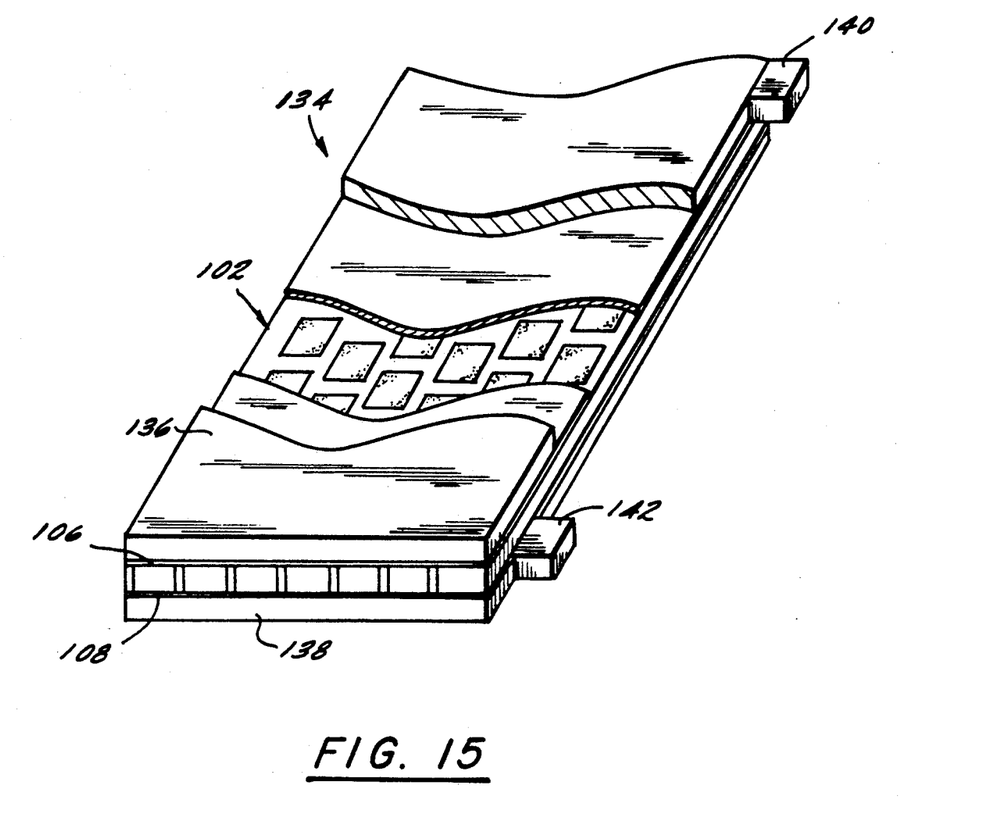
FIG. 15 is a perspective view, partially broken away, showing the high dielectric constant sheet material of FIG. 1 constructed in a bus bar configuration.

Referring now to FIG. 15, a bus bar in accordance with the present invention is shown generally at 134. Bus bar 134 is comprised of two conductive layers 136 and 138 sandwiching therebetween high capacitance flexible dielectric layer 102. Each conductive layer 136 and 138 includes a plurality of tabs 140 and 142, respectively, extending outwardly therefrom. Conductive layers 136 and 138 may be attached to flexible dielectric layer 102 using any known method such as solder or a suitable conductive adhesive. However, in a preferred embodiment, conductive layers 136, 138 and outer electrodes 106, 108 are provided with roughened edges and bonded together with a non-conductive adhesive as in FIG. 3. Also, as in the FIG. 3 bonding technique, a metallized coating of tin or nickel is preferably applied to the conductive layers 136, 138 and/or outer electrodes 106, 108. High capacitance layer 102 has already been described in detail above and may be composed of any of the components shown in FIGS. 108. Tabs 140 and 142 extend from conductive layers 136 and 138 and provide a connection with external circuit components. Conductive layers 136 and 138 can be made of copper, or any other conductive material.

Figure 16:
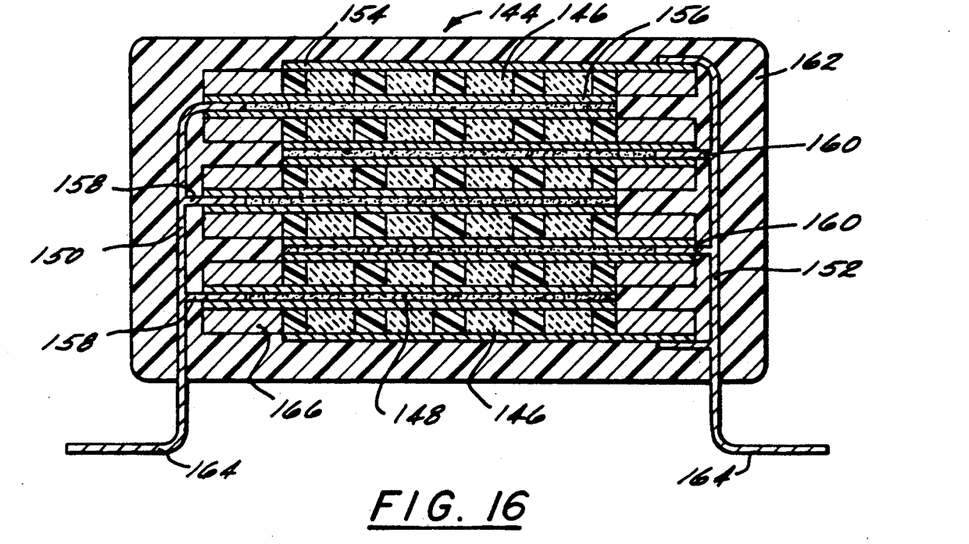
FIG. 16 is a cross-sectional elevation view showing the high dielectric constant sheet material of FIG. 1 constructed as a multilayer capacitive element.
Figure 17:
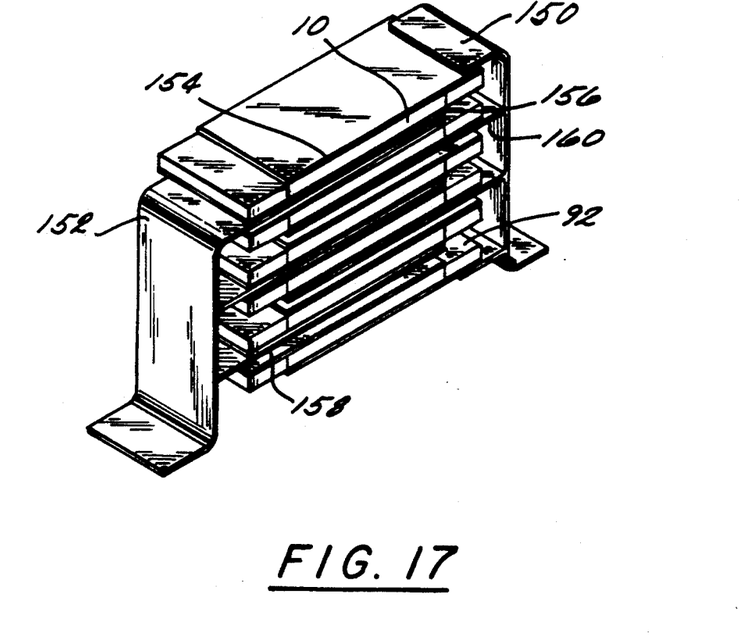
FIG. 17 is a perspective view of the capacitor of FIG. 16, with the outer insulative encapsulation removed.
Figure 18:
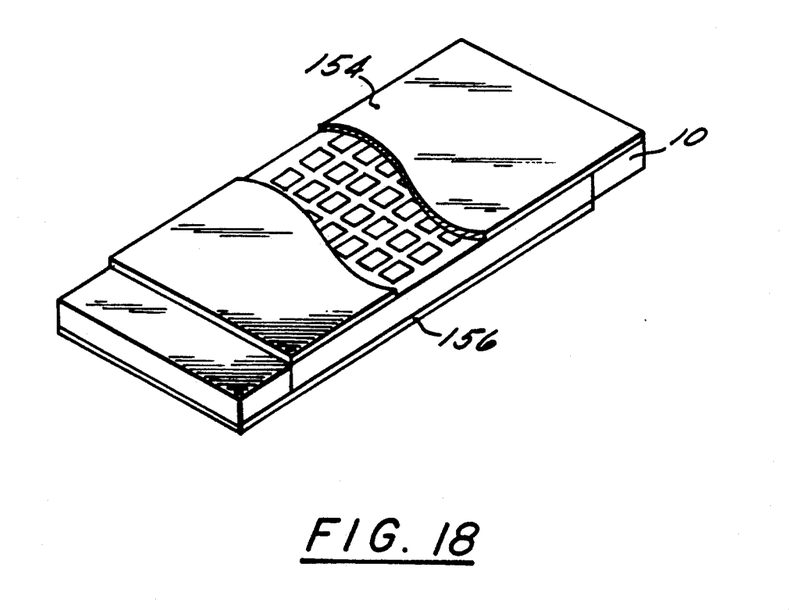
FIG. 18 is a perspective view, partially broken away, depicting a capacitive element used in the capacitor of FIG. 16.

Referring now to FIGS. 16–18, a high dielectric capacitor is shown generally at 144. Capacitor 144 is comprised of a plurality of spacer layers 146 of flexible dielectric sheet material of the type described in FIGS. 1–8. Layers 146 are separated by layers 148 of a suitable insulative material. A pair of conductive ribbons 150 and 152 are electrically connected to respective adjacent metallized layers 154 and 156 of each layer 146. Thus, conductive ribbon 150 includes a plurality of substantially perpendicular extensions 158 which electrically connect to alternating metallized layers 154 and 156 while ribbon 152 includes a plurality of extensions 160 for like electrical connection. Once in contact dielectric insulators 146 and conductor ribbons 150 and 152 are encased in an encapsulating material 162. One end of each ribbon 150 and 152 extends beyond the edge of the encapsulating material 162 to form bent tabs 164. Tabs 164 of capacitor 144 allow for electrical contact with other circuitry.

Dielectric layers 144 are comprised primarily of high dielectric flexible sheet material 102 and include opposed polymeric end portions 166.

Each conductive ribbon 150 and 152 contacts dielectric layers at opposing ends. Conductive ribbons 150 and 157 are flattened elongated, relatively wide piece of conductive material. Extensions 158 and 160 are displaced parallel form one another at preselected distances to enable the extensions to contact the dielectric layers at appropriate locations.

Because of the high dielectric flexible layer 102 and wide conductive ribbon 150 and 152, capacitor 144 has both high capacitance and low inductance. A capacitor with these electrical properties is will suited for to noise suppression in high current power distribution systems digital computers, telecommunications modules, AC ripple filtering in DC power supplies.

Figure 19:
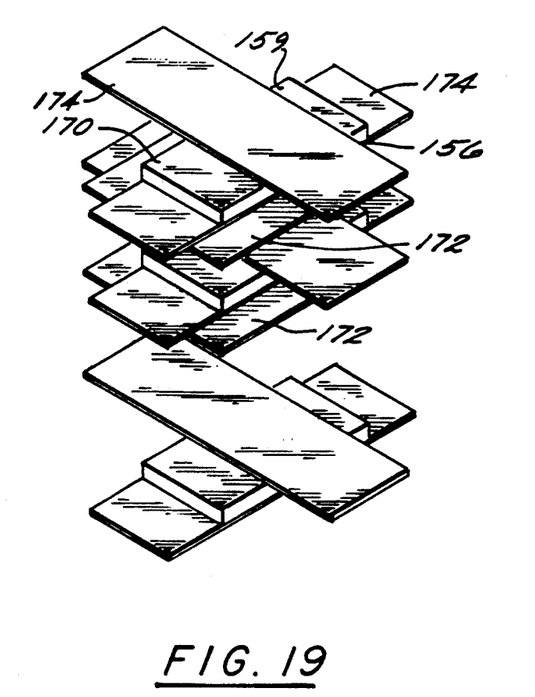
FIG. 19 is an exploded, perspective view of an alternative embodiment to the capacitor of FIG. 16.
Figure 20:
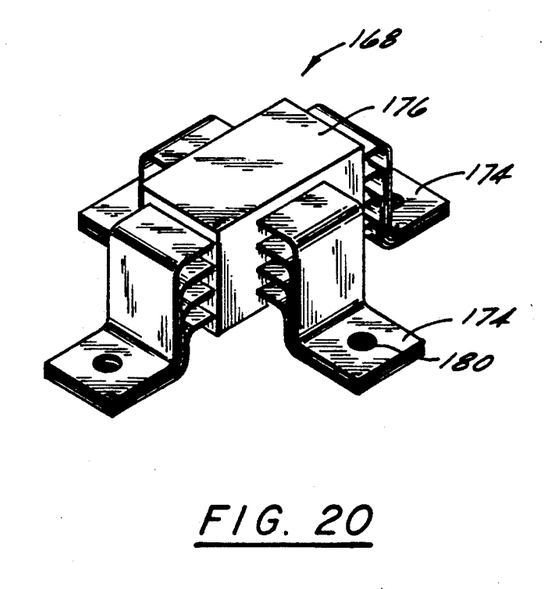
FIG. 20 is a perspective view of the fully assembled capacitor of FIG. 19.

Referring now to FIGS. 19–20, an alternate embodiment of capacitor 144 is shown generally at 168. Capacitor 168 comprises a stack-up alternating dielectric layers 170, insulating layers 172, and conductive layers 174. Conductive layers 174 are perpendicular to one another and every other layer 170 is separated by a dielectric layer 170, an insulating layer 172 and a perpendicular conductive layer 174. Of course, dielectric layers 170 are of the type disclosed in FIGS. 1–8 and at 102 in FIGS. 16–18. Each conductive layer is perpendicular to an adjacent conductive layer as shown in the FIGS. As in the FIG. 16 embodiment, in the embodiment of FIG. 20, conductive layers 174 are electrically attached (via solder or conductive adhesive) to the metallized layers on dielectric sheet 170. The stack-up includes as many layers as are needed to reach a predetermined capacitance. When all the layers are aligned as required, an encapsulating material 176 encapsulates the layers.

Insulating layer 172 may be any insulative material, but preferably comprises an insulating adhesive or suitable polymer. Conductive layers 174 are comprised of a flat elongated conductive metal. Each layer 174 is bent together to form a uniform tab 178. Tab 178 has a placement means (e.g., opening 180) for attachment to circuitry.

The embodiment of FIGS. 19-20 has an advantage over the embodiment of FIGS. 16-18 in that only one main body is required to maintain capacitance for two circuits. However, both the multi-layer capacitor embodiments of FIGS. 16-18 exhibit excellent electrical and mechanical characteristics including low inductance, low ESR and a compact, sturdy body for ease of installation.

The high dielectric chips 16 are Preferably comprised of a suitable ceramic material such as barium titanate, lead magnesium niobate or iron tungsten niobate. Alternatively, chips 16 may be comprised of an internal boundary layer dielectric material such as $(sr.04Ba0.6)TiO_3 + 10H_2O$ as described in aforementioned U.S. Pat. No. 4,908,258. In still another alternative, rather than using high dielectric constant (ceramic) pellets, the discrete high dielectric constant monolayer may be comprised of an array of multilayer ceramic chips such as those disclosed at FIGS. 4 and 10 in U.S. Pat. No. 4,748,537 and at FIGS. 11-16 in U.S. Pat. No. 4,706,162, all of which are assigned to the assignee hereof and incorporated herein by reference.

The present invention provides large capacitance values over small areas. For example, using Z5U ceramic chips 16 at 25° C., and varying the amount of the chips as set out below in Table 1, the following capacitance values are obtained from this invention using a single layer of high dielectric sheet material.

TABLE 1

| SLC CHIP COVERAGE[1] | Chip Thickness (.009 in.) | Chip Thickness (.005 in.) |
| --- | --- | --- |
| 10% | 5.4 uF/ft$^2$ | 9.7 uF/ft$^2$ |
| 25% | 13.5 uF/ft$^2$ | 24.3 uF/ft$^2$ |
| 50% | 27.0 uF/ft$^2$ | 48.6 uF/ft$^2$ |
| 75% | 40.5 uF/ft$^2$ | 72.9 uF/ft$^2$ |
| 85% | 46.0 uF/ft$^2$ | 82.8 uF/ft$^2$ |

[1]Indicates % of chips in a square foot of high dielectric sheet material.

It will be appreciated that if multiple layers of the material of this invention are used as in FIGS. 9, 14, 16 and 17, then the capacitance values will be doubled, tripled or the like depending upon the number of layers (e.g., the capacitance values will be tripled in the three layer construction of FIG. 9).

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A high dielectric constant flexible sheet comprising:
   a dielectric spacer sheet having opposed, substantially planar upper and lower surfaces;
   a plurality of windows formed through said spacer sheet between said upper and lower surfaces, said plurality of windows being formed in a preselected pattern;
   a plurality of high dielectric chips, each of said chips having side, top and bottom surfaces, one each of said chips being disposed in a respective window so that said top and bottom surfaces of said chips are exposed on said respective upper and lower surfaces of said spacer sheet;
   said top surfaces of said chips and said upper surface of said spacer sheet together defining an upper planar surface;
   said bottom surfaces of said chips and said lower surface of said spacer sheet together defining a lower planar surface;
   an upper metallic foil attached to said upper planar surface; and
   a lower metallic foil attached to said lower planar surface.

2. The sheet of claim including:
   a first layer of adhesive between said upper planar surface and said upper metallic foil, and
   a second layer of adhesive between said lower planar surface and said lower metallic foil.

3. The sheet of claim 2 including:
   first roughened surfaces on said upper metallic foil and said top surfaces of said chips to permit electrical contact between said upper metallic foil and said chips; and
   second roughened surfaces on said lower metallic foil and said bottom surfaces of said chips to permit electrical contact between said lower metallic foil and said chips.

4. The sheet of claim 2 wherein:
   said adhesive comprises a B-staged adhesive.

5. The sheet of claim 1 including:
   conductive metallization applied to said top and bottom surfaces of said chip.

6. The sheet of claim 1 wherein:
   said spacer sheet includes a periphery which extends outwardly beyond said upper and lower metallic foil.

7. The sheet of claim 1 wherein:
   said upper or lower metallic foil comprises at least two electrically isolated areas of differing potential.

8. The sheet of claim 1 including:
   at least one via or through-hole.

9. The sheet of claim 1 wherein:
   said chips have a cylindrical or polygonal shape.

10. The sheet of claim 1 including:
    groups of discrete chips being disposed in at least one of said windows.

11. The sheet of claim 1 wherein the chips comprise barium titanate, lead magnesium niobate or iron tungsten niobate.

12. The sheet of claim 1 wherein the chips comprise multilayer capacitive elements having exposed top and bottom electrodes which electrically contact said first and second metallic foils.

13. The sheet of claim 1 wherein the first and second metallic layers comprise aluminum, copper, nickel or tin.

14. The sheet of claim 1 wherein said chips each comprise a common material.

15. The sheet of claim 1 wherein at least one of said chips comprise a material different than that of the other of said chips.

16. A multilayer circuit board comprising:

a first layer of insulating material having opposed first and second surfaces;

a second layer of insulating material having opposed first and second surfaces;

a first conductive layer on at least a portion of said first surface of said first layer of insulating material;

a second conductive layer on at least a portion of said first surface of said second layer of insulating material;

at least one high dielectric flexible sheet between said second surfaces of said first and second layers of insulating material, said high dielectric flexible sheet including;

a dielectric spacer sheet having opposed, substantially planar upper and lower surfaces;

a plurality of windows formed through said spacer sheet between said upper and lower surfaces said plurality of windows being formed in a preselected pattern;

a plurality of high dielectric chips, each of said chips having side, top and bottom surfaces, one each of said chips being disposed in a respective window so that said top and bottom surfaces of said chips are exposed on said respective upper and lower surfaces of said spacer sheet;

said top surfaces of said chips and said upper surface of said spacer sheet together defining an upper planar surface;

said bottom surfaces of said chips and said lower surface of said spacer sheet together defining a lower planar surface;

an upper conductive layer attached to said upper planar surface; and a lower conductive layer attached to said lower planar surface.

17. The board of claim 16 including:

at least one first via connecting said first conductive layer to said first voltage level plane; and at least one second via connecting said second conductive layer to said second voltage level plane.

18. The board of claim 17 including:

an opening through said high dielectric flexible sheet; and at least one of said first or second vias passing through said opening.

19. The board of claim 16 including:

at least one plated through hole interconnecting said first and second conductive layers, said plated through hole being out of contact with said first and second voltage level planes.

20. The board of claim 16 including:

a plurality of adjacent high dielectric flexible sheets between said first and second sheets of insulating material.

21. The board of claim 16 wherein:

said first and second conductive layers each comprise respective first and second conductive patterns.

22. A bus bar comprising:

a dielectric spacer sheet having opposed, substantially Planar upper and lower surfaces;

a plurality of windows formed through said spacer sheet between said upper and lower windows, said plurality of windows being formed in a preselected pattern;

a plurality of high dielectric chips, each of said chips having side, top and bottom surfaces, one each of said chips being disposed in a respective window so that said top and bottom surfaces of said chips are exposed on said respective upper and lower surfaces of said spacer sheet;

said top surfaces of said chips and said upper surface of said spacer sheet together defining an upper planar surface;

said bottom surfaces of said chips and said lower surface of said spacer sheet together defining a lower planar surface;

an upper conductive layer attached to said upper planar surface; and a lower conductive layer attached to said lower planar surface;

a first outer conductive layer having at least one first conductive tab extending therefrom, said first outer conductive layer being electrically and mechanically connected to said upper conductive layer; and a second outer conductive layer having at least one second conductive tab extending therefrom, said second outer conductive layer being electrically and mechanically connected to said lower conductive layer.

23. The bus bar of claim 22 wherein:

said first and second outer conductive layers are connected to said respective upper and lower conductive layers with solder or conductive adhesive.

24. The bus bar of claim 22 including:

a first layer of adhesive between said first outer conductive layer and said upper conductive layer; and a second layer of adhesive between said second outer conductive layer and said lower conductive layer.

25. The bus bar of claim 24 including:

first roughened surfaces on said upper conductive layer and said first outer conductive layer to permit electrical contact between said upper conductive surface and said first outer conductive layer; and second roughened surfaces on said lower conductive layer and said second outer conductive layer to permit electrical contact between said lower conductive surface and said second outer conductive layer.

26. A multilayer capacitor comprising:

(1) a plurality of spaced, discrete dielectric sheets, each of said discrete dielectric sheets including;

(a) a dielectric spacer sheet having opposed, substantially planar upper and lower surfaces;

(b) a plurality of windows formed through said spacer sheet between said upper and lower surfaces said plurality of windows being formed in a preselected pattern;

(c) a plurality of high dielectric chips, each of said chips having side, top and bottom surfaces, one each of said chips being disposed in a respective window so that said top and bottom surfaces of said chips are exposed on said respective upper and lower surfaces of said spacer sheet;

said top surfaces of said chips and said upper surface of said spacer sheet together defining an upper planar surface;

said bottom surfaces of said chips and said lower surface of said spacer sheet together defining a lower planar surface;

(d) an upper conductive layer attached to said upper Planar surface; and (e) a lower conductive layer attached to said lower planar surface;

(2) at least a pair of electrically isolated conductive electrodes, each of said electrodes being electrically connected to respective upper and lower conductive layers on said plurality of discrete dielectric sheets; and (3) electrically insulative material between said spaced plurality of discrete dielectric sheets.

27. The capacitor of claim 26 including:
electrically conductive adhesive means bonding said conductive electrodes to said respective upper and lower conductive layers on said discrete dielectric sheets.

28. The capacitor of claim 26 including:
electrically conductive solder means bonding said conductive electrodes to said respective upper and lower conductive layers on said discrete dielectric sheets.

29. The capacitor of claim 26 including:
tab means on said conductive electrodes.

30. The capacitor of claim 26 wherein:
said tab means extend from at least two opposing sides of said capacitor.

31. The capacitor of claim 26 wherein:
each of said conductive electrodes include a plurality of extensions for electrically connecting to said respective upper and lower conductive layers.

32. The capacitor of claim 31 wherein:
said extension extend substantially perpendicular to said conductive electrodes.

33. The capacitor of claim 26 wherein:
each of said electrodes is substantially transverse from an adjacent electrode.

34. A high dielectric constant flexible sheet comprising:
a dielectric spacer sheet having opposed, substantially planar upper and lower surfaces;
a plurality of windows formed through said spacer sheet between said upper and lower surfaces, said plurality of windows being formed in a preselected pattern;
a plurality of high dielectric chips, each of said chips having side, top and bottom surfaces, one each of said chips being disposed in a respective window so that said top and bottom surfaces of said chips are exposed on said respective upper and lower surfaces of said spacer sheet;
said top surfaces of said chips and said upper surface of said spacer sheet together defining an upper planar surface;
said bottom surfaces of said chips and said lower surface of said spacer sheet together defining a lower planar surface;
an upper conductive layer attached to said upper planar surface;
a lower conductive layer attached to said lower planar surface; and
wherein said spacer sheet includes a periphery which extends outwardly beyond said upper and lower conductive layers.

35. A capacitor comprising:
a dielectric spacer sheet having opposed, substantially planar upper and lower surfaces;
a plurality of windows formed through said spacer sheet between said upper and lower surfaces, said plurality of windows being formed in a preselected pattern;
a plurality of high dielectric chips, each of said chips having side, top and bottom surfaces, one each of said chips being disposed in a respective window so that said top and bottom surfaces of said chips are exposed on said respective upper and lower surfaces of said spacer sheet;
said top surfaces of said chips and said upper surface of said spacer sheet together defining an upper planar surface;
said bottom surfaces of said chips and said lower surface of said spacer sheet together defining a lower planar surface;
an upper metallic foil attached to said upper planar surface; and
a lower metallic foil attached to said lower planar surface; and
at least a pair of electrically isolated conductive electrodes, each of said electrodes being electrically connected to respective upper and lower metallic foils.

36. The capacitor of claim 35 including:
electrically conductive adhesive means bonding said conductive electrodes to said respective upper and lower metallic foils.

37. The capacitor of claim 35 including:
electrically conductive solder means bonding said conductive electrodes to said respective upper and lower metallic foils.

38. The capacitor of claim 35 including:
tab means on said conductive electrodes.

39. The capacitor of claim 35 wherein:
said tab means extend from at least two opposing sides of said capacitor.

40. The capacitor of claim 35 wherein:
each of said conductive electrodes include a plurality of extensions for electrically connecting to said respective upper and lower metallic foils.

41. The capacitor of claim 40 wherein:
said extension extend substantially perpendicular to said conductive electrodes.

42. The capacitor of claim 35 wherein:
each of said electrodes is substantially transverse from an adjacent electrode.

43. A multilayer capacitor comprising:
(1) a plurality of spaced, discrete dielectric sheets, each of said discrete dielectric sheets including;
  (a) a dielectric spacer sheet having opposed, substantially planar upper and lower surfaces;
  (b) a plurality of windows formed through said spacer sheet between said upper and lower surfaces, said plurality of windows being formed in a preselected pattern;
  (c) a plurality of high dielectric chips, each of said chips having side, top and bottom surfaces, one each of said chips being disposed in a respective window so that said top and bottom surfaces of said chips are exposed on said respective upper and lower surfaces of said spacer sheet;
said top surfaces of said chips and said upper surface of said spacer sheet together defining an upper planar surface;
said bottom surfaces of said chips and said lower surface of said spacer sheet together defining a lower planar surface;
(2) an upper metallic foil attached to said upper planar surface of a upper spacer sheet;
(3) a lower metallic foil attached to said lower planar surface of a lower spacer sheet;
(4) a middle metallic foil attached to corresponding said upper and lower surfaces of each pair of adjacent spacer sheets, wherein said middle metallic foil is sandwiched between each pair of said adjacent spacer sheets; and (5) a pair of electrically isolated conductive tabs, each of said tabs being electrically connected to respective upper and lower metallic foils and each of said tabs being electrically connected to a corresponding at least one middle metallic foil.

44. The capacitor of claim 43 including:

a layer of adhesive between each of said upper and lower planar surfaces and each of said corresponding upper, lower and middle metallic foils.

45. The capacitor of claim 44 wherein:

said adhesive comprises a B-staged adhesive.

46. The capacitor of claim 43 including:

roughened surfaces on each of said upper, lower and middle metallic foils and on each of said corresponding top and bottom surfaces of said chips to permit electrical contact between said upper, lower and middle metallic foils and said chips.

47. The capacitor of claim 43 including:

conductive metallization applied to said top and bottom surfaces of said chip.

* * * * *

UNITED STATES PATENT AND TRADEMARK OFFICE
CERTIFICATE OF CORRECTION

PATENT NO. : 5,185,690
DATED : February 9, 1993
INVENTOR(S) : Mark L. Miller

It is certified that error appears in the above-indentified patent and that said Letters Patent is hereby corrected as shown below:

Column 1, line 60 delete "5,065,285" and insert --5,065,284--
Column 6, line 41 delete "is is" and insert --is--
Column 7, line 8 delete "Physical" and insert --physical--
Column 8, line 44 delete "form" and insert --from--
          line 50 delete "will" and insert --well--
          line 51 insert --,-- after "system"
Column 9, line 19 delete "Preferably" and insert --preferably--
Column 10, line 19 delete "claim" and insert --claim 1--
Column 10, line 21 delete "," and insert --;--
Column 10, line 41 delete "foil" and insert --foils--
Column 10, line 43 delete "foil" and insert --foils--
Column 10, line 61 delete "layers" and insert --foils--
Column 11, line 17 insert --,-- after "surfaces"
Column 11, line 60 delete "Planar" insert --planar--
Column 12, line 49 insert --,-- after "surfaces"
Column 12, line 64 delete "Planar" insert --planar--
Column 13, line 26 delete "extension" and insert --extensions--
Column 14, line 36 delete "extension" and insert --extensions--

Signed and Sealed this

Twenty-fifth Day of January, 1994

Attest:

Attesting Officer

BRUCE LEHMAN

Commissioner of Patents and Trademarks